(12) United States Patent
Shioga et al.

(10) Patent No.: US 7,832,069 B2
(45) Date of Patent: Nov. 16, 2010

(54) CAPACITOR DEVICE AND METHOD OF MANUFACTURING THE SAME

(75) Inventors: Takeshi Shioga, Kanagawa (JP); John David Baniecki, Kanagawa (JP); Kazuaki Kurihara, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 297 days.

(21) Appl. No.: 11/790,732

(22) Filed: Apr. 27, 2007

(65) Prior Publication Data

US 2009/0007405 A1    Jan. 8, 2009

Related U.S. Application Data

(62) Division of application No. 11/057,193, filed on Feb. 15, 2005, now Pat. No. 7,227,736.

(51) Int. Cl.
*H01G 7/00* (2006.01)

(52) U.S. Cl. ............ 29/25.42; 29/25.41; 29/830; 29/842; 29/846; 29/847; 174/260; 174/261; 174/262; 174/263; 361/300; 361/306.3; 427/79

(58) Field of Classification Search ............ 29/846, 29/847, 842, 840, 25.41, 830, 25.35; 174/260–263; 361/300–306.3; 427/79
See application file for complete search history.

(56) References Cited

U.S. PATENT DOCUMENTS

| | | | |
|---|---|---|---|
| 6,266,227 B1 | 7/2001 | Konushi et al. | |
| 6,333,857 B1 | 12/2001 | Kanbe et al. | |
| 6,479,615 B2 * | 11/2002 | Fukuoka et al. | ............ 528/170 |
| 6,573,584 B1 * | 6/2003 | Nagakari et al. | ............ 257/528 |
| 6,624,501 B2 | 9/2003 | Shioga et al. | |
| 6,754,950 B2 * | 6/2004 | Furukawa et al. | ............ 29/832 |
| 6,794,481 B2 * | 9/2004 | Amagai et al. | ............ 528/219 |
| 6,937,458 B2 | 8/2005 | Seshan | |
| 2002/0177298 A1 * | 11/2002 | Konishi et al. | ............ 438/630 |
| 2003/0071300 A1 | 4/2003 | Yashima et al. | |

FOREIGN PATENT DOCUMENTS

| | | |
|---|---|---|
| JP | 55-166947 | 12/1980 |
| JP | 10-335182 | 12/1998 |

(Continued)

OTHER PUBLICATIONS

Office Action dated Apr. 8, 2008 issued in corresponding Japanese U.S. Appl. No. 2002-238455.

*Primary Examiner*—Derris H Banks
*Assistant Examiner*—Azm Parvez
(74) *Attorney, Agent, or Firm*—Westerman, Hattori, Daniels & Adrian, LLP

(57) ABSTRACT

A capacitor device includes a capacitor Q constituted by a lower electrode (12) formed on a substrate (10), a dielectric film (14), and an upper electrode (16); an insulating film (18) covering the capacitor Q; a first contact hole (18*a*) formed in the insulating film (18) on a connection portion (16*a*) of the upper electrode (16); an electrode pad (20) for preventing a diffusion of solder, formed in the first contact hole (18*a*); and a solder bump (22) electrically connected to the electrode pad (20), and the upper electrode (16) has a protrusion portion (16*a*) protruding from the dielectric film (14), and is connected to the first contact hole (18*a*) on the protrusion portion (16*a*).

6 Claims, 10 Drawing Sheets

FOREIGN PATENT DOCUMENTS

| | | |
|---|---|---|
| JP | 2000-244130 | 9/2000 |
| JP | 2000-340456 | 12/2000 |
| JP | 2001-185444 A | 7/2001 |
| JP | 2002-164258 | 6/2002 |
| JP | 2002-222925 | 8/2002 |
| JP | 2002-231577 | 8/2002 |

* cited by examiner

CAPACITOR DEVICE AND METHOD OF MANUFACTURING THE SAME

CROSS-REFERENCE TO RELATED APPLICATIONS

This application is a Divisional of U.S. patent application Ser. No. 11/057,193, filed on Feb. 15, 2005, which is a Continuation application of International application PCT/JP2003/008754, filed on Jul. 9, 2003, which is based on and claims priority of Japanese Patent Application No. 2002-238455 filed on Aug. 19, 2002, the entire contents of which are incorporated herein by reference.

TECHNICAL FIELD

The present invention relates to a capacitor device and a method of manufacturing the same, and more particularly to a capacitor device and a method of manufacturing the same, which has a capacitor constituted by a lower electrode, a dielectric film and an upper electrode.

BACKGROUND ART

In recent years, in semiconductor devices such as digital LSIs including a microprocessor, a tendency of decrease in a power supply voltage is developed because of influence of a speeding up of an operation speed and a low power consumption. In such a LSI, its operation power supply voltage tends to be unstable when its impedance changes rapidly. In order to stabilize the power supply voltage and to decrease high frequency noises, a decoupling capacitor is inserted between a power supply voltage line of the LSI and a ground line thereof.

Particularly, since a stable operation in a higher frequency (GHz) range is required in a high speed operation digital LSI, an improvement in performance of the decoupling capacitor such as high frequency followership is desired. Therefore, a capacitor device having a thin film capacitor structure in which a technology capable of reducing a thickness of a dielectric film to increase capacitor capacity is introduced has been devised. Such a thin film capacitor is manufactured based on a thin film process for forming a metallic film, oxide and the like on a base substrate such as silicon. Since a microprocessing is possible in this thin film processes, a capacitor having a low inductance structure can be obtained.

FIGS. 1A to 1E and FIGS. 2A to 2D are section views showing an example of a method of manufacturing a capacitor device having a thin film capacitor according to prior art. In the conventional method of manufacturing a capacitor device, as shown in FIG. 1A and FIG. 1B, after a silicon substrate 100 is prepared, a lower electrode 102 for a capacitor formed of a metallic film is formed on the silicon substrate 100. Thereafter, as shown in FIG. 1C and FIG. 1D, a dielectric film 104a is grown on the lower electrode 102, and then a metallic film 106a for an upper electrode is grown on the dielectric film 104a.

Next, as shown in FIG. 1E, by etching predetermined portions of the upper electrode metallic film 106a and the dielectric film 104a, an upper electrode 106 for a capacitor and a dielectric film 104 for a capacitor are formed, and a connection portion 102a of the lower electrode 102 are exposed. Thus, a capacitor Q constituted by the lower electrode 102, the capacitor dielectric film 104 and the upper electrode 106 is formed.

Subsequently, as shown in FIG. 2A, a protection insulating film 110 having first and second contact holes 110a and 110b respectively is formed on a connection portion 106x of the upper electrode 106 and the connection portion 102a of the lower electrode 102. This protection insulating film 110 is formed of a polyimide resin film having a thickness of, for example, about 3 μm, and the first and second contact holes 110a and 110b are formed by performing exposure and developing processings for predetermined portions of the polyimide resin film.

Next, as shown in FIG. 2B, a barrier metallic film 112a is formed on the protection insulating film 110 and in the first and second contact holes 110a, 110b. This barrier metallic film 112a is formed of a lamination film, and is formed by being buried in the first and second contact holes 110a and 11b by a sputtering method and electroplating.

Subsequently, as shown in FIG. 2C, the barrier metallic film 112a is patterned by photoetching, whereby an electrode pads 112 are left in the first and second contact holes 110a, 110b. These electrode pads 112 are formed as a metallic plug, which has a thickness of about 3 μm or more, in the first and second contact holes 110a, 110b.

Next, a resist film (not shown) having an opening portion is formed on the electrode pads 112, and a solder bump is formed in the opening portion by electroless plating, followed by removing the resist film. Thereafter, as shown in FIG. 2D, the solder bump undergoes a thermal treatment (wet back) to reflow, whereby spherical solder bumps 116 are obtained.

In the above described manner, the solder bump 116s are formed in a state where the solder bumps 116 are electrically connected to the connection portion 106x of the upper electrode 106 and the connection portion 102a of the lower electrode 102 through the plug-shaped electrode pads 112 having a thickness of about 3 μm or more.

The above described electrode pads 112 are called an under bump metal (UBM), and have a function to prevent that solder in the solder bumps 116 diffuse into films constituting the capacitor Q disposed under the bumps 116 to react therewith during the foregoing thermal treatment (wet back) process.

As described above, the conventional art adopts the structure in which the first contact holes 110a are formed on the upper electrode 106 of the portion where the lower electrode 102, the dielectric film 104 and the upper electrode 106 are laminated, and in which the upper electrode 106 is electrically connected to the solder bumps 116 through the electrode pads 112 (UBM) formed in the first contact holes 110a.

Since the above described electrode pads 112a (UBM) need to have a comparatively thick film of thickness of about 3 μm or more to prevent the diffusion of the solder, tensile stress is apt to occur just below the electrode pads 112a due to influences of the electro pads 112a. Therefore, there is a problem that peeling is prone to occur along an interface between the upper electrode 106a and the dielectric film 104a below the electrode pads 112a.

Furthermore, since the polyimide resin film having a comparatively high coefficient of thermal expansion (40 to 50 ppm/° C.) is generally used as the protection insulating film 110, tensile stress occurs near the upper electrode 106a below the protection film 110. Therefore, there is a problem that adhesion of the upper electrode 106a and the dielectric film 104a becomes weak and peeling is prone to occur along an interface between them.

DISCLOSURE OF THE INVENTION

An object of the present invention is to provide a capacitor device and a method of manufacturing the same, which are capable of preventing peeling of films constituting a capacitor in a capacitor device having a structure in which solder bumps are respectively connected to upper and lower electrodes of the capacitor.

The present invention relates to a capacitor device, which comprises a substrate; a capacitor constituted by a lower electrode formed on or above the substrate, a dielectric film formed on the lower electrode, and an upper electrode formed on the dielectric film; an insulating film covering the capacitor; a first contact hole formed in the insulating film on a connection portion of the upper electrode; an electrode pad for preventing a diffusion of solder, and formed in the first contact hole; and a solder bump electrically connected to the electrode pad, wherein the upper electrode includes a protrusion portion protruding from the dielectric film, and the upper electrode is connected to the first contact hole on the protrusion portion.

As described above, when the electrode pad for preventing the diffusion of the solder is formed on a structure in which the dielectric film having a comparatively weak adhesion, and the upper or lower electrode are laminated, peeling is apt to occur along an interface between the dielectric film and the electrode owing to stress of the electrode pad. As a result of earnest investigations into this problem, the inventors of the present invention have found a capacitor structure in which the interface between the dielectric film and the electrode does not exist below the electrode pad for preventing the diffusion of the solder.

In one preferable mode of the present invention, the lower electrode includes a connection portion in a protrusion portion protruding into one direction from the dielectric film, and the upper electrode includes a connection portion in a protrusion portion protruding into a direction different from the direction from the dielectric film. Then, the electrode pad for preventing the diffusion of the solder is formed in the first contact hole formed in the insulating film on the connection portion of the upper electrode, and a solder bump is connected to this electrode pad. Specifically, a structure is provided, in which the dielectric film and the lower electrode do not exist below the connection portion to which the electrode pad of the upper electrode is connected.

Therefore, even if tensile stress occurs in a film below the electrode pad due to influences thereof, there exists only the upper electrode in the form of a single layer in that area, and a structure having the interface of the weak adhesion between the dielectric film and the upper or lower electrode does not exist. Accordingly, even when an electrode pad having a thickness of, for example, about 3 μm or more is provided under the solder bump in order to prevent the diffusion of the solder, the peeling at the interface between the films constituting the capacitor never occurs. Thus, it is possible to improve reliability of the capacitor device having the structure in which the solder bump is connected to the upper and lower electrodes of the capacitor through the electrode pad.

Furthermore, the present invention relates to a capacitor device, which comprises a substrate; a lower electrode for a capacitor having a function to prevent a diffusion of solder, and formed on or above the substrate; a dielectric film for the capacitor formed on the lower electrode; an upper electrode for the capacitor having the function to prevent the diffusion of the solder, and formed on the dielectric film; an insulating film covering the capacitor; contact holes respectively formed in the insulating film on connection portions of the upper and lower electrodes; and solder bumps formed in the contact holes.

In the present invention, instead of the formation of the electrode pad for preventing the diffusion of the solder according to the above described invention, the upper and lower electrodes function as the film for preventing the diffusion of the solder by increasing thicknesses of the upper and lower electrodes. For example, when a Pt film is used as the upper and lower electrodes, the upper and lower electrodes can be allowed to function as the film for preventing the diffusion of the solder by setting a thickness of the Pt film to 400 nm or more. Therefore, when the solder bump is subjected to a thermal treatment (wet back) to reflow, the diffusion of the solder is blocked by the upper and lower electrodes having the thick film, so that the diffusion of the solder into the capacitor can be prevented.

Furthermore, in the present invention, since the electrode pad can be omitted, it is unnecessary to consider peeling of films constituting the capacitor due to stress of the electrode pad. Furthermore, from the viewpoint of manufacturing the capacitor device of the present invention, since a step of forming an electrode pad having a thick film can be omitted, manufacturing cost of the capacitor device can be decreased.

The present invention relates to a capacitor device, which comprises a substrate; a capacitor constituted by a lower electrode formed on or above the substrate, a dielectric film formed on the lower electrode, and an upper electrode formed on the dielectric film; a first insulating film covering the capacitor; a first contact hole formed in the first insulating film on a connection portion of the upper electrode; a wiring connected to the connection portion of the upper electrode, the wiring extending onto the first insulating film from the first contact hole; a second insulating film covering the wiring; a third contact hole formed in the second insulating film on a connection portion provided at a position in the wiring, the position keeping away from the first contact hole; an electrode pad for preventing a diffusion of solder, formed in the third contact hole; and a solder bump electrically connected to the electrode pad.

In the present invention, the electrode pad is not formed in the first contact hole on the connection portion of the upper electrode, but the wiring connected to the upper electrode is formed so as to be extended onto the second insulating film on the upper electrode through the first contact hole. Specifically, the upper electrode is re-wired on the first insulating film on the wiring by the wiring, and a connection portion electrically connected to the solder bump is provided at a position in the wiring, the position keeping away from the first contact hole. Then, the third contact hole is opened in the second insulating film on the connection portion of the wiring, and the electrode pad for preventing the diffusion of the solder is formed in the third contact hole. The solder bump is formed on the electrode pad.

As described above, in the present invention, the connection portion of the upper electrode is allowed to extend on the second insulating film thereon by the wiring, and the connection portion of the wiring electrically connected to the solder bump is provided at a position on the first insulating film, the position keeping away from the first contact hole. Then, the electrode pad is formed in the third contact hole formed on the connection portion of the wiring.

Accordingly, even if a lamination layer structure of the ferro dielectric film and the upper electrode or a lamination layer structure of the ferro dielectric film and the lower electrode exists below the electrode pad, tensile stress occurred from the electrode pad is exerted on the first insulating film just below the electrode pad. Accordingly, stress exerted on the films constituting the capacitor is relaxed, so that the peeling of the films is prevented.

BRIEF DESCRIPTION OF THE DRAWINGS

FIG. 8B is viewed from above.

BEST MODE FOR CARRYING OUT THE INVENTION

Embodiments of the present invention will be described with reference to the accompanying drawings below.

First Embodiment

FIGS. 3A to 3E and FIGS. 4A to 4C are section views showing a method of manufacturing a capacitor device according to a first embodiment of the present invention.

Figure 1A:
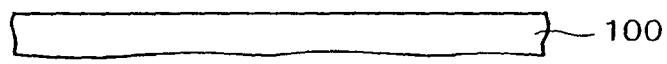
FIGS. 1A to 1E are section views (No. 1) showing an example of a method of manufacturing a capacitor device having a thin film capacitor according to the prior art.
Figure 1B:
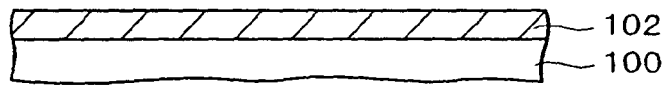
Figure 1C:
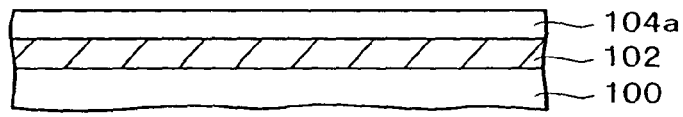
Figure 1D:
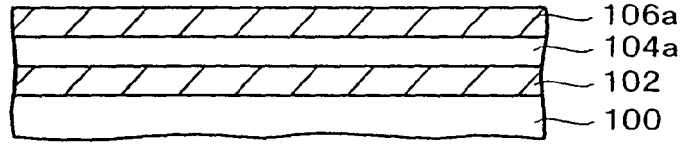
Figure 1E:
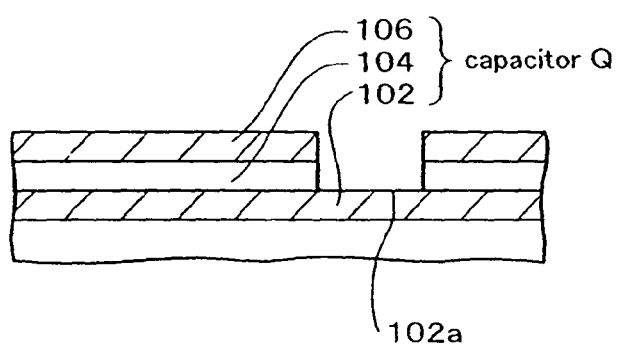
Figure 2A:
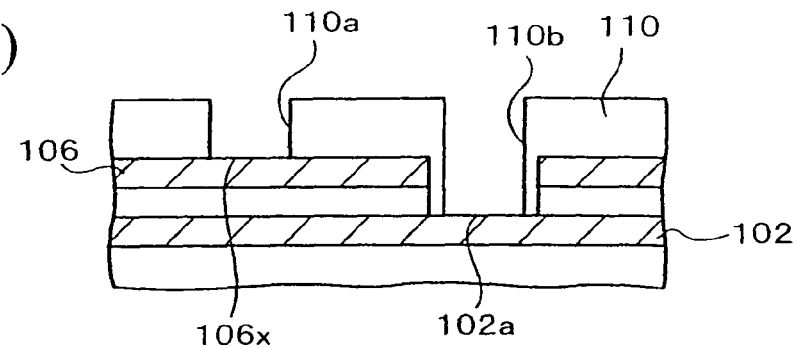
FIGS. 2A to 2D are section views (No. 2) showing an example of the method of manufacturing a capacitor device according to the prior art.
Figure 2B:
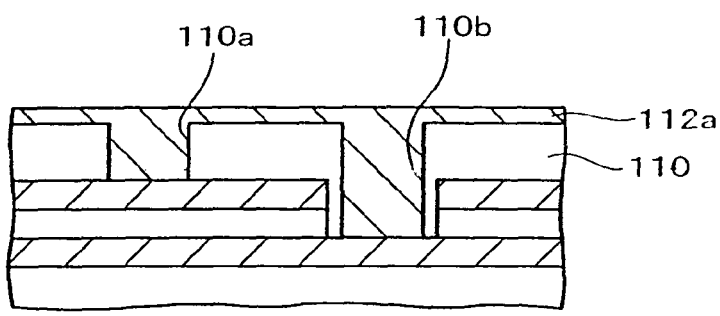
Figure 2C:
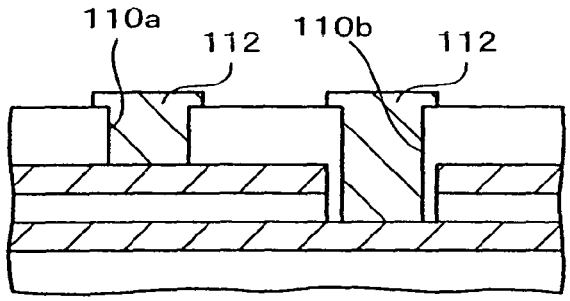
Figure 2D:
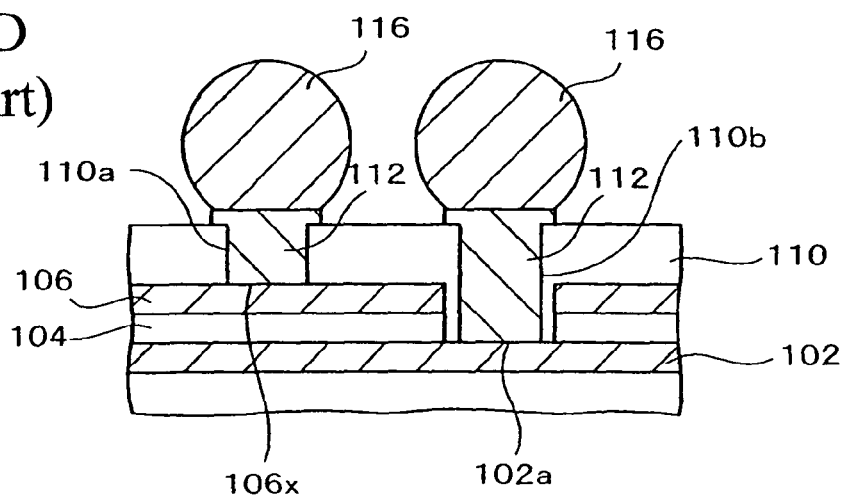
Figure 3A:
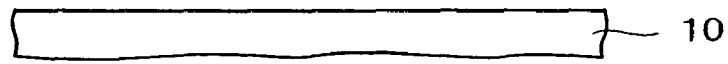
FIGS. 3A to 3E are section views (No. 1) showing a method of manufacturing a capacitor device according to a first embodiment of the present invention.

In the method of manufacturing the capacitor device according to the first embodiment of the present invention, first, a silicon substrate 10 is prepared as an example of a substrate as shown in FIG. 3A. Thereafter, a titanium oxide film ($TiO_2$) having a thickness of 20 nm and a platinum (Pt) film having a thickness of 100 nm are sequentially grown either on the silicon substrate 10 or while interposing a silicon oxide film and/or the like therebetween, and thus a first conductive film is formed. At this time, the $TiO_2$ film and the Pt film are grown by a sputtering method in which a substrate temperature is kept at about 500° C.

Figure 3B:
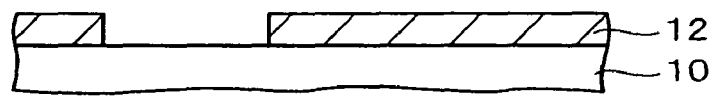

Subsequently, as shown in FIG. 3B, the Pt and $TiO_2$ films (first conductive film) are patterned by photoetching, whereby a lower electrode 12 for a capacitor is formed. At this time, the Pt film is etched by ion milling by use of argon gas, and the $TiO_2$ film is dry-etched by use of argon gas, chlorine group gas and/or the like. Note that as the lower electrode 12, a single layered film or a lamination film selected out of a Au film, a Cu film, a Pd film, a Ru film, an Ir film, a Ru oxide film, an Ir oxide film, a Pt oxide film and the like may be used.

Subsequently, a ferro dielectric film for the capacitor is formed on the silicon substrate 10 and the lower electrode 12.

In this embodiment, a mode in which titanium oxide strontium barium ($Ba_xSr_{1-x}TiO_3$, hereinafter referred to as BST) is formed by a sol-gel method as the ferro dielectric film will be exemplified.

Specifically, sol solution is first prepared by blending alkoxide of a metallic element composing BST into organic solution so that the thin film has a predetermined composition. Subsequently, water is added to this sol solution. The sol solution is hydrolyzed to cause condensation polymerization. Thus, polymer-like gel is prepared. The gel obtained by such a manner is coated onto a structure of FIG. 3B by a spin coat method under conditions of 2000 rpm and 30 seconds, and a coated film is grown.

Subsequently, to evaporate the solvent in the coated film, the coated film is dried at a temperature atmosphere of about 120° C., and then preliminary baking is carried out at 400° C. Then, a series of processes including coating of the gel, drying and preliminary baking is repeated two times. Thereafter, real baking (thermal treatment) is carried out at about 700° C., whereby the coated film is crystallized. Thus, a BST film having a thickness of 200 nm, a relative dielectric constant of 400 and a dielectric loss of 2% or less is obtained. Although the above described thermal treatment should be carried out in oxygen atmosphere to prevent deficiency of oxygen, the above described thermal treatment may be carried out in an air atmosphere or an inert gas atmosphere.

Figure 3C:
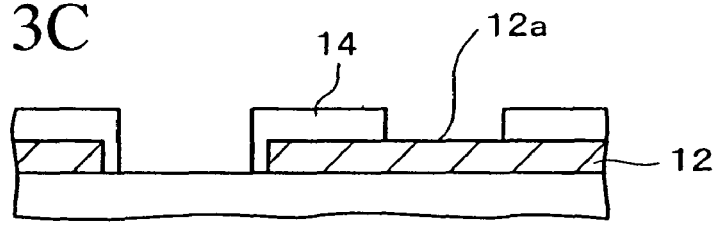

Next, as shown in FIG. 3C, a pattern of a resist film (not shown) is formed on the BST film by use of photolithography, and the BST film is dry-etched by an ion milling method using Ar gas and using the resist film as a mask, whereby a ferro dielectric film 14 for a capacitor is formed. Thus, a connection portion 12a connected to a solder bump of the lower electrode 12 is delimited and exposed, and a part of the silicon substrate 10 where a connection portion of the upper electrode is disposed afterward is exposed.

As a material of the ferro dielectric film 14, a PZT group material such as PZT, PLZT and PLCSZT, a Bi layered structure compound material such as $SrBi_2Ta_2O_9$ and $SrBi_2(Ta, Nb)_2O_9$, strontium titanate or other metal oxide ferro dielectrics may be used in addition to BST. Specifically, it is possible to use metal oxide containing at least one selected out of strontium (Sr), barium (Ba), lead (Pb), zirconium (Zr), bismuth (Bi), tantalum (Ta), titanium (Ti), magnesium (Mg) and niobium (Nb). Furthermore, as a method of forming the ferro dielectric film 14, there are a sputtering method, a MOD (metal organic deposition) method or a MOCVD (organic metal CVD) method in addition to the sol gel method. A mode for forming the ferro dielectric film 14 by sputter method will be described in detail in a second embodiment.

Figure 3D:
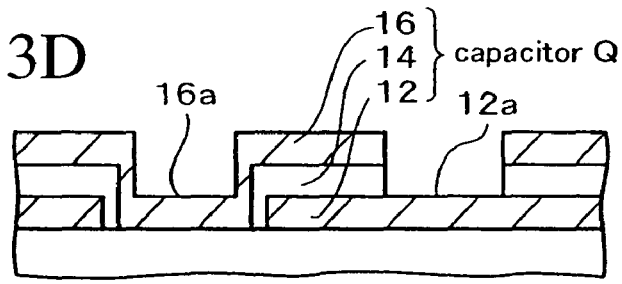

Subsequently, a Pt film (second conductive film) having a thickness of about 100 nm is grown on the structure of FIG. 3C by a sputtering method performed under a condition that a substrate temperature is about 350° C. Thereafter, as shown in FIG. 3D, a resist film pattern (not shown) is formed by photolithography, and the Pt film (second conductive film) is dry-etched by an ion milling method using Ar gas and the resist film pattern as a mask. Thus, an upper electrode 16 for a capacitor is formed. At this time, the connection portion 12a of the lower electrode 12 is exposed again, and at the same time the connection portion 16a electrically connected to the solder bump of the upper electrode 16 is delimited on the portion of the silicon substrate 10 where the ferro dielectric film 14 is removed. Specifically, the ferro dielectric film 14 is not disposed under the connection portion 16a of the upper electrode 16.

By the above described processes, as shown in FIG. 3D, a capacitor Q constituted by the lower electrode 12, the dielectric film 14 for the capacitor and the upper electrode 16 can be obtained.

As the upper electrode 16, a single layered film or a lamination film selected from a group including a Au film, a Cu film, a Pd film, a Ru film, an Ir film, Ru oxide film, Ir oxide film, and a Pt oxide film may be used, the same as in the case of the lower electrode 12.

Next, Ar plasma is radiated onto the exposed surfaces of the upper and lower electrodes 16 and 12, and minute irregularities are formed in these surfaces. By forming the minute irregularities in the surfaces of the upper and lower electrodes 16 and 12, it is possible to increase adhesion of the surfaces of the upper and lower electrodes 16 and 12 with an insulative protection film to be formed later by a so called anchor effect.

Figure 3E:
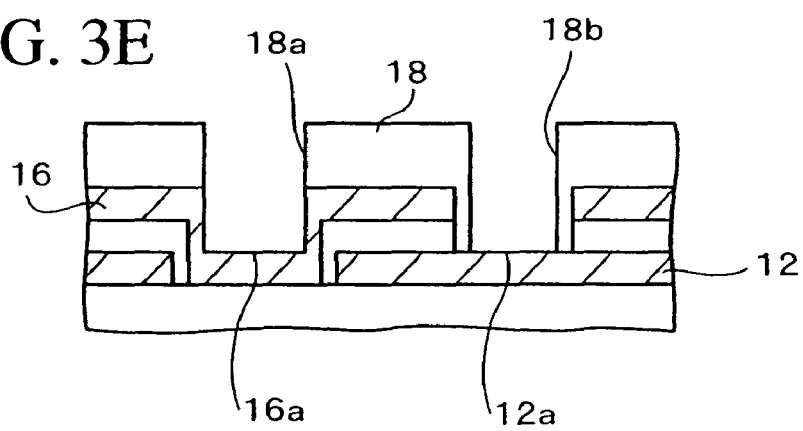

Next, silane coupling agent made of amino-propyl-triethoxysilane ($NH_2(CH_2)_3Si(OCH_2)_3$) is coated onto the structure of FIG. 3D by a spin coating method under conditions of 1500 rpm and 30 sec, and thereafter is heated under conditions of 90° C. and 90 sec, whereby a tight adhesion material layer is formed. Subsequently, as shown in FIG. 3E, after photosensitive polyimide resin having a thickness of about 3 μm or more is coated, predetermined portions are exposed and developed, whereby an insulative protection film 18 (insulation film) having first and second contact holes 18a and 18b is formed. The first contact hole 18a opens the connection portion 16a of the upper electrode 16 and the second contact hole 18b opens the connection portion 12a of the lower electrode 12.

At this time, since the minute irregularities are formed in the surfaces of the upper and lower electrodes 16 and 12, which are base layers, and since insulative protection film 18 is formed through the tight adhesion material layer made of silane coupling agent, the insulative protection film 18 is formed in a state where it has a strong adhesion with the upper and lower electrodes 16 and 12. Furthermore, as the insulating protection film 18, polyimide resin having a thermal expansion coefficient of about 15 ppm/° C. or less should be used in order to relax stress exerted on the base layers. When the thermal expansion coefficient of the polyimide resin is comparatively as high as about 40 through 50 ppm/° C., tensile stress occurs for the base layers. Accordingly, peeling is apt to occur along an interface between the upper electrode 16 and the ferro dielectric film 14. As the polyimide resin having the thermal expansion coefficient of 15 ppm/° C. or less, ZFPI (manufactured by Nippon Zeon Co, Ltd.), which is polyimide fluoride, can be used, for example.

Figure 4A:
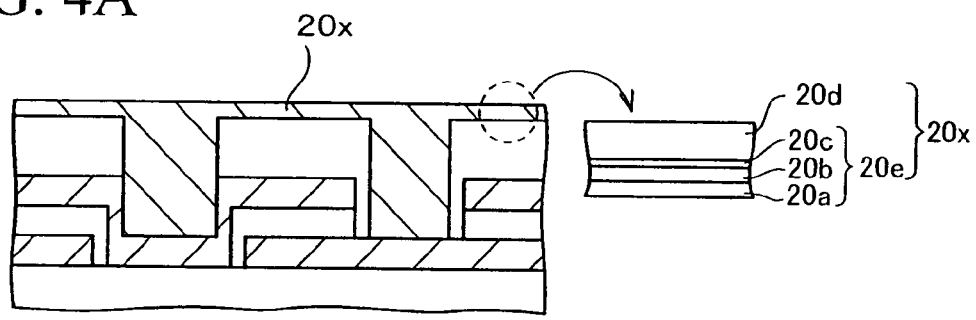
FIGS. 4A to 4C are section views (No. 2) showing the method of manufacturing a capacitor device according to the first embodiment of the present invention.

Next, as shown in FIG. 4A, a metallic film 20e constituted by a titanium (Ti) film 20a having a thickness of 300 nm, a copper (Cu) film 20b having a thickness of 200 nm and a Ni film 20c having a thickness of 50 nm, which are formed from bottom up in this order, is grown in the first and second contact holes 18a, 18b and on the insulating protection film 18 by a sputtering method under a condition that a substrate temperature is about 150° C.

Subsequently, by electroplating using the metallic film 20e as a plating charge supplying film, a Ni plating film 20d having a thickness of about 4 μm is grown in the metallic film 20e. Thus, a barrier metallic film 20x constituted by the metallic film 20e and the Ni plating film 20d is formed in a state where the barrier metallic film 20x is buried in the first and second contact holes 18a, 18b. Note that this barrier metallic film 20x is not limited to the above described example, but is formed by a single layered film or a lamination film selected out of groups such as Cr, Ti, Cu and Ni.

Figure 4B:
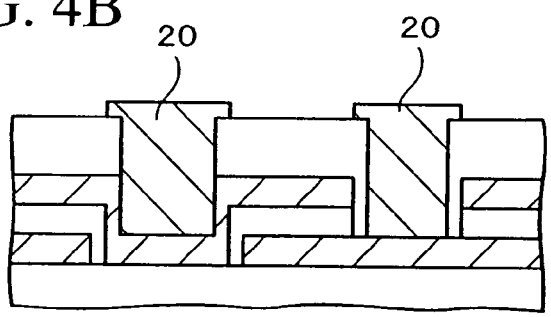
Figure 4C:
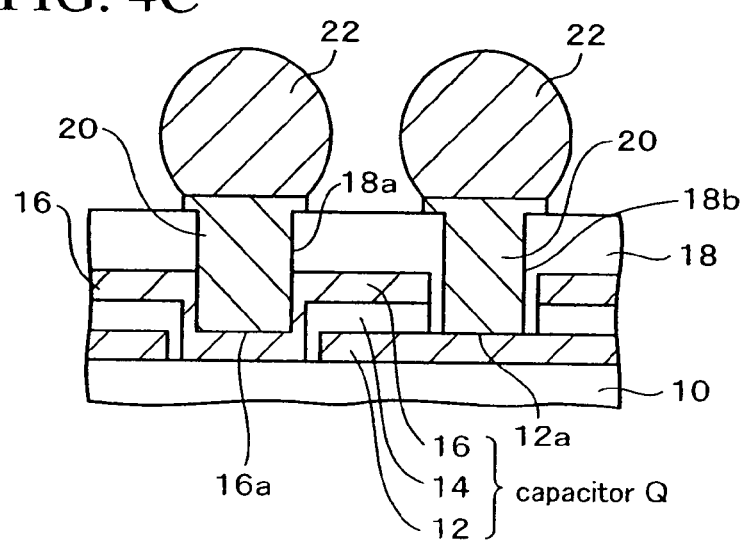

Subsequently, as shown in FIG. 4B, a resist film pattern (not shown) is formed by photolithography, and the barrier metallic film 20x is wet-etched by use of the resist film pattern as a mask, whereby an electrode pads 20 formed as a metallic plug are obtained in the first and second contact holes 18a, 18b. These electrode pads 20 are called UBM (under bump metal), and have a function to prevent solder from diffusing toward the upper and lower electrodes 16 and 12 when the solder bumps connected to the electrode pads 20 are thermally treated (wet back) in a post process. In order to prevent the diffusion of the solder, the electrode pads 20 are formed to a thickness of about 3 μm or more.

Next, a resist film (not shown) having opening portions on the electrode pads 20 is formed, and solder bumps made of, for example, Sn-3.5 wt % Ag are formed in the opening portions. Subsequently, after the resist film is removed, the solder bumps are reflown by a thermal treatment (wet back), whereby spherical bumps 22 are obtained. At this time, since the electrode pads 20 are formed to the thickness of about 3 μm or more, there is no fear that the melted solder diffuses into the upper and lower electrodes 16, 12.

In the above described manner, the solder bumps 22 are electrically connected to the connection portion 16a of the upper electrode 16 and the connection portion 12a of the lower electrode 12 through the electrode pads 20 (UBM). Thus, a capacitor device 1 of this embodiment is completed.

In the capacitor device 1 of this embodiment, the lower electrode 12, the ferro dielectric film 14, and the upper electrode 16 are formed on the silicon substrate 10 from bottom up. The lower electrode 12 is etched to be removed in its portion where the connection portion 16a of the upper electrode 16 is disposed. Furthermore, the ferro dielectric film 14 is etched to be removed in its portion where the connection portion 12a of the lower electrode 12 is formed and in its portion where the connection portion 16a of the upper electrode 16 is disposed. Furthermore, the upper electrode 16 is etched to be removed in its portion where the connection portion 12a of the lower electrode 12 is formed, and the connection portion 16a of the upper electrode 16 is disposed on the silicon substrate 10.

Then, the connection portion 16a of the upper electrode 16 is electrically connected to one of the solder bumps 22 through the electrode pad 20. In the same way, the connection portion 12a of the lower electrode 12 is electrically connected to the solder bumps 22 through the electro pad 20.

As described above, with respect to the lower electrode 12, the connection portion 12a is provided in its extension portion which protrudes to the outside in one direction from the dielectric film 14. With respect to the upper electrode 16, the connection portion 16a is provided in other extension portion (protrusion portion) which protrudes to the outside in a direction different from the direction from the dielectric film 14. Specifically, the structure is adopted, in which the dielectric film 14 and the lower electrode 12 do not exist under the connection portion 16a of the upper electrode 16 connected to one of the solder bumps 22 through the electrode pad 20.

Therefore, even if tensile stress occurs in a film under the electrode pad 20 due to influences of the electrode pad 20, there simply exists the upper electrode 16 as a single layered film in that area. As a result, a structure having an interface between the ferro dielectric film 14 having weak adhesion and the lower electrode 12 or between the ferro dielectric film 14 and the upper electrode 12 does not exist. Accordingly, even when the electrode pad 20 having a thickness of about 3 μm or more is provided under the solder bump 20 in order to prevent the diffusion of the solder, peeling at an interface between the films constituting the capacitor Q never occurs unlike the prior arts.

As described above, the structure is adopted in the capacitor device 1 of this embodiment, in which the peeling of the films constituting the capacitor Q never occurs even when the electrode pad 20x having a thickness of about 3 μm is provided under the solder bump 22. Accordingly, it is possible to increase reliability of the capacitor device 1 having the structure in which the solder bump 22 is connected to the capacitor Q.

Furthermore, since stress for the base layer is relaxed by using the polyimide resin having the thermal expansion coefficient of 15 ppm/° C. or less as the insulative protection film 18, peeling at the interface between the ferro dielectric film 14 having the weak adhesive and the lower electrode 12 or between the ferro dielectric film 14 and the upper electrode 12 due to the stress of the insulative protection film 18 is prevented.

Second Embodiment

FIG. 5A to FIG. 5D are section views showing a method of manufacturing a capacitor device according to a second embodiment. The second embodiment differs from the first embodiment in that the ferro dielectric film is formed by a sputtering method not by a sol gel method. Accordingly, detailed descriptions of the same processes as those of the first embodiment will be omitted.

Figure 5A:
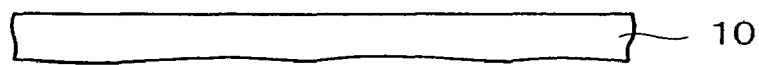
FIGS. 5A to 5D are section views showing a method of manufacturing a capacitor device according to a second embodiment of the present invention.
Figure 5B:
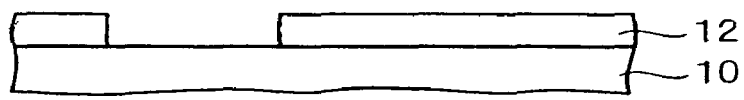

First, as shown in FIG. 5A and FIG. 5B, by the same method as the first embodiment, after a $TiO_2$ film and a Pt film are sequentially grown on a silicon substrate 10 by a sputtering method under a condition that a substrate temperature is 400° C., these films are patterned, whereby a lower electrode 12 for a capacitor is formed.

Subsequently, a BST film is grown on the lower electrode 12 and the silicon substrate 10 by a sputtering method. As an example of sputtering conditions, the growth of the BST film is carried out under conditions that a substrate temperature is 600° C., a flow rate of Ar gas is 80 sccm, a flow rate of $O_2$ gas is 10 sccm, a pressure is 30 mTorr, a high frequency application power is 500 W, and a film growth time is 20 minutes. Thus, the BST film having a thickness of 100 nm, a relative dielectric constant of 500 and a dielectric loss of 2% is formed.

Figure 5C:
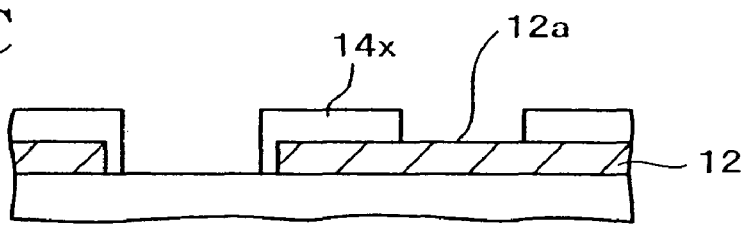
Figure 5D:
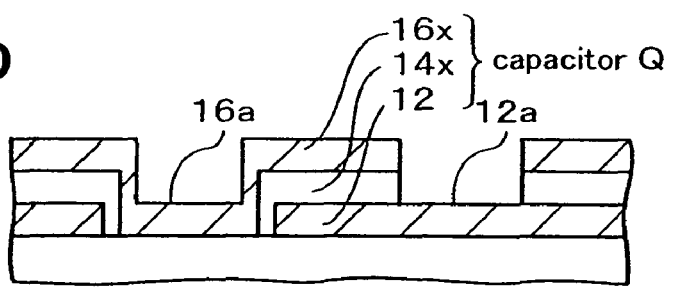

Next, as shown in FIG. 5C, the BST film is patterned by the same method as the first embodiment, and thus a ferro dielectric film 14x for the capacitor is formed. Subsequently, a Au film having a thickness of about 100 nm is grown on the lower electrode 12 and the silicon substrate 10 by a sputtering method under a condition that a substrate temperature is about 400° C. Thereafter, as shown in FIG. 5D, the Au film is etched by use of an ion milling method using Ar gas, and thus an upper electrode 16x for the capacitor is formed. With such processes, a capacitor Q having a structure similar in the first embodiment is obtained.

Next, by a similar method to that of the first embodiment, a protection insulation film 18, electrode pads 20 (UBM) and solder bumps 22 are formed based on the processes shown in FIG. 3E to FIG. 4C. With the above described processes, a capacitor device having the same function as that of the first embodiment is completed. Also in the capacitor device of the second embodiment, the same effects as those of the first embodiment are exercised.

Third Embodiment

FIG. 6A to FIG. 6F are section views showing a method of manufacturing a capacitor device according to a third embodiment. The third embodiment differs from the first embodiment in that a solder diffusion prevention function is provided by increasing the thicknesses of upper and lower electrodes, thus making it possible to prevent diffusion of solder even when an electro pad (UBM) is omitted.

Figure 6A:
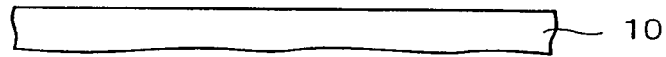
FIGS. 6A to 6F are section views showing a method of manufacturing a capacitor device according to a third embodiment of the present invention.
Figure 6B:
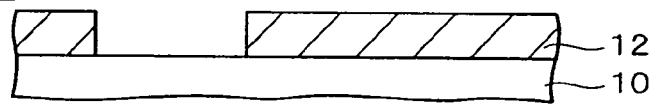

In the method of manufacturing the capacitor device according to the third embodiment, as shown in FIG. 6A and FIG. 6B, after a Pt film (first solder diffusion prevention conductive film) having a thickness of 400 nm is grown on a silicon substrate 10 by a sputtering method, the Pt film is patterned by photoetching, and thus a lower electrode 12 for a capacitor is formed.

Figure 6C:
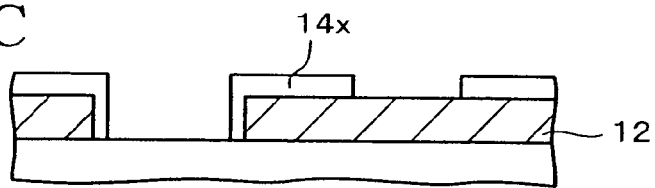

Thereafter, as shown in FIG. 6C, by a similar method in the second embodiment, after a BST film is grown on the lower electrode 12 and the silicon substrate 10, the BST film is patterned by photoetching, whereby a ferro dielectric film 14x for the capacitor is formed.

Figure 6D:
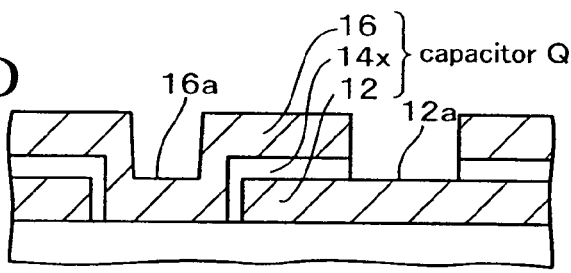

Next, as shown in FIG. 6D, a Pt film (second solder diffusion prevention conductive film) having a thickness of about 400 nm is grown by a sputtering method, and the Pt film is patterned by photoetching, whereby an upper electrode 16 for the capacitor is formed. Thus, a capacitor Q constituted by the lower electrode 12, the ferro dielectric film 14x and the upper electrode 16 is formed while providing the same positional relationship as that of the first embodiment to them.

Figure 6E:
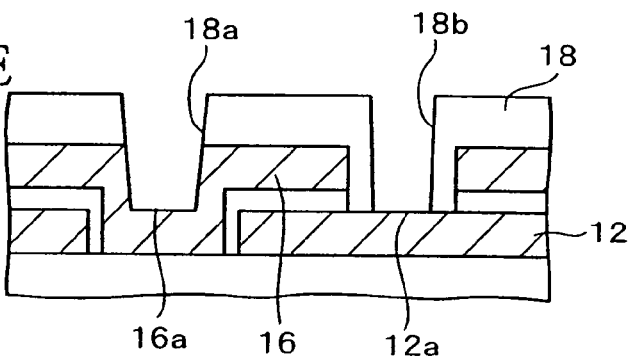

Next, as shown in FIG. 6E, by a similar method in the first embodiment, an insulative protection film 18 made of polyimide resin, which has first and second contact holes 18a, 18b on connection portions 16a and 12a of the upper and lower electrodes 16, 12, is formed.

Subsequently, the formation process of the electrode pads 20 in the first embodiment is omitted, and solder bumps are formed in the first and second contact holes 18a, 18b by electroless plating using the insulative protection film 18 as a mask. Note that a resist film having opening portions on the first and second contact holes 18a, 18b may be formed and solder bumps may be formed by electroless plating using this resist film as a mask.

Figure 6F:
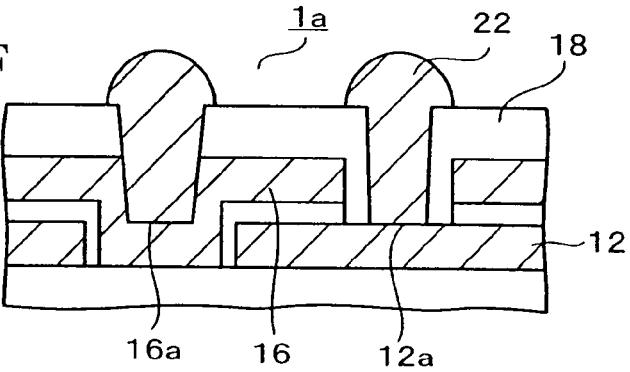

Thereafter, the solder bumps undergo a thermal treatment (wet back) to reflow, whereby solder bumps 22 directly connected to the connection portions 16a, 12a of the upper and lower electrodes 16, 12 respectively are formed as shown in FIG. 6F.

With the above described processes, the capacitor device 1a according to the third embodiment is manufactured. In the capacitor device 1a of the third embodiment, the electrode pads used in the first embodiment are omitted, and the thicknesses of the lower and upper electrodes 16, 12 are made thicker to be 400 nm or more, whereby the upper and lower electrodes 16, 12 are allowed to exercise the solder diffusion prevention function. Therefore, when the solder bumps undergo the thermal treatment (wet back) to reflow, the diffusion of the solder is blocked by the upper electrodes 16 and the lower electrode 12 (Pt film) 12 having the thick films, and the diffusion of the solder to the capacitor Q side is prevented.

Furthermore, since the electrode pads 20x of the first embodiment can be omitted in the third embodiment, the peeling of the films constituting the capacitor Q due to the stress of the electrode pads 20 needs not to be considered.

Furthermore, since the processes for forming the electrode pads 20x can be omitted in the light of manufacturing the capacitor device 1a of the third embodiment, it is possible to omit the plurality of sputtering processes and the plurality of plating processes for forming the thick films, and it is possible to reduce manufacturing cost of the capacitor device 1a.

In the third embodiment, when it is assumed that it is impossible to prevent the diffusion of the solder perfectly in spite that the thicknesses of the upper electrode 16 and the lower electrode are increased, the electrode pads may be formed as in the case of the first embodiment. In this case, since the upper and lower electrodes 16 and 12 are formed so as to have the thick films enough to be capable of basically preventing the diffusion of the solder, it is unnecessary to make the electro pads enough thick to be buried in the opening portions 18a, 18b of the protection insulative film 18, and the thicknesses of the electrode pads can be made as thin as, for example, 1 μm or less. As described above, with respect to the mode for forming the electrode pads, it is possible to increase throughput of the plating process and the wet etching process, and large merits on manufacturing are brought about. In addition, since the thicknesses of the electrode pads can be made thin, the stress for the base film is relaxed.

Fourth Embodiment

Figure 7A:
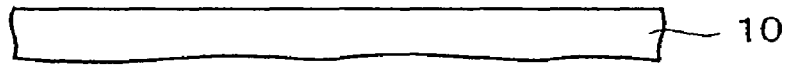
FIGS. 7A to 7E are section views (No. 1) showing a method of manufacturing a capacitor device according to a fourth embodiment of the present invention.
Figure 7B:
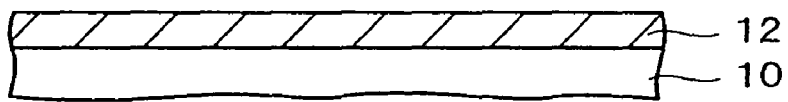
Figure 7C:
Figure 7D:
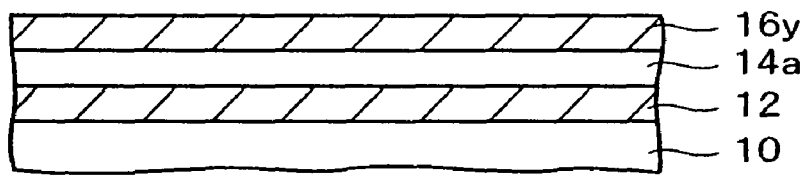
Figure 7E:
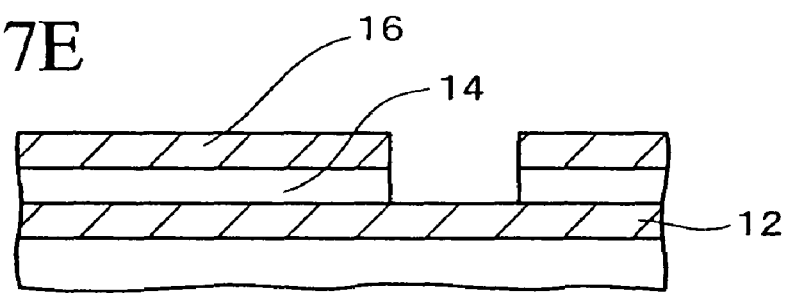
Figure 8A:
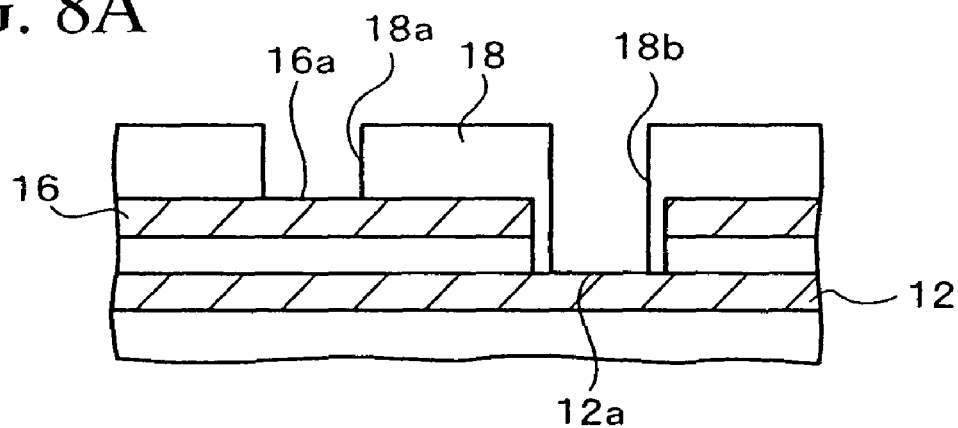
FIGS. 8A to 8C are section views (No. 2) showing the method of manufacturing a capacitor device according to the fourth embodiment of the present invention.
Figure 8B:
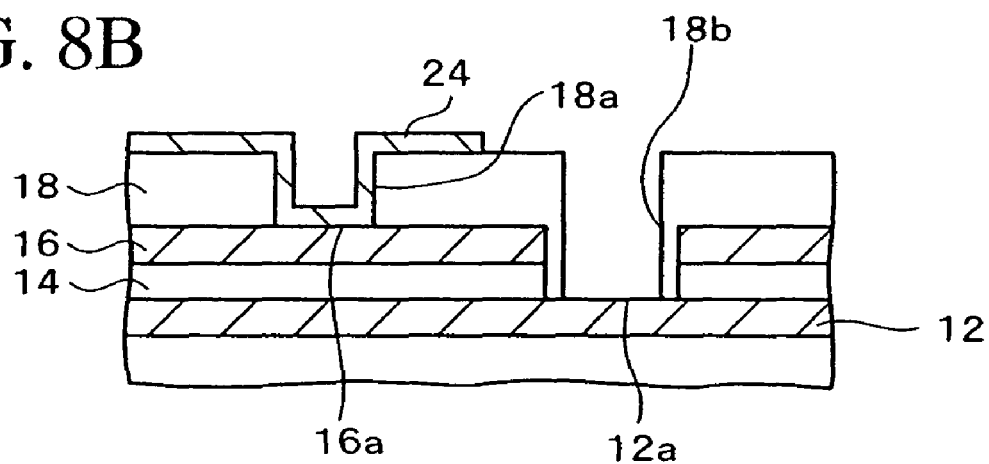
Figure 8C:
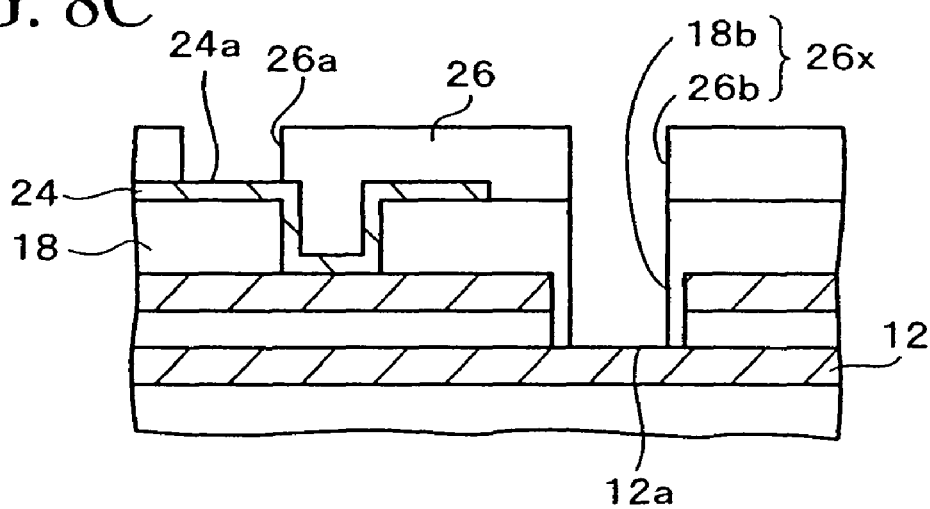
Figure 9A:
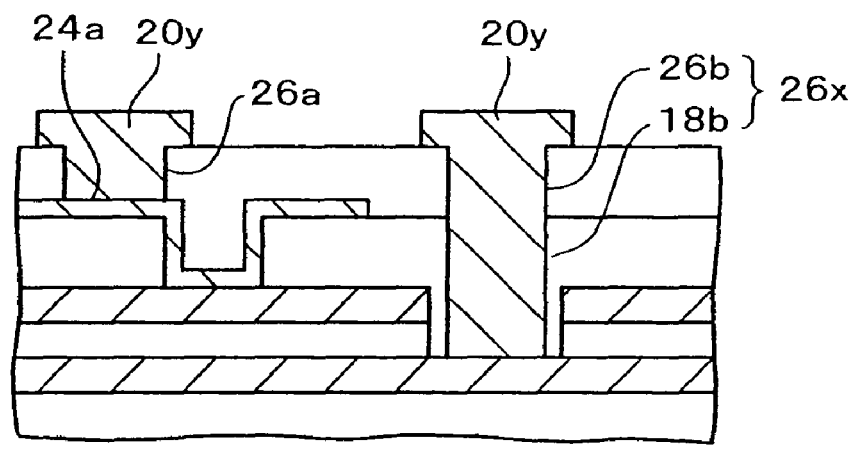
FIGS. 9A to 9B are section views (No. 3) showing the method of manufacturing a capacitor device according to the fourth embodiment of the present invention.

FIG. 7A to FIG. 7E, FIG. 8A to FIG. 8C, FIG. 9A, and FIG. 9B are section views showing a method of manufacturing a capacitor device of a fourth embodiment of the present invention. FIG. 10 is a plan view when the capacitor device of FIG. 8B is viewed from above. The fourth embodiment differs from the first embodiment in that a wiring connected to a connection portion of an upper electrode is wired on an insulating film on the upper electrode through a contact hole and provided to be extended therefrom, and in that a solder bump is formed on the contact hole on the connection portion of this wiring through an electrode pad. Detailed descriptions of the same processes as those of the first and second embodiments are omitted.

In a method of manufacturing the capacitor device of the fourth embodiment, as shown in FIG. 7A and FIG. 7B, a silicon substrate 10 is prepared, and a $TiO_2$ film having a thickness of 20 nm and a Pt film having a thickness of 100 nm are sequentially grown on the silicon substrate 10 by a sputtering method under a condition that a substrate temperature is 400° C. Thus, a lower electrode 12 for a capacitor is formed.

Thereafter, as shown in FIG. 7C, a BST film is grown on the lower electrode 12 by a sputtering method, and thus a ferro dielectric film 14a is formed. As an example of sputtering conditions of the ferro dielectric film 14a, the sputtering is carried out under conditions that a substrate temperature is 350° C., a flow rate of Ar gas is 30 sccm, a flow rate of $O_2$ gas is 4 sccm, a pressure is 10 mTorr, a high frequency application power is 200 W, and a film growth time is 30 minutes. Thus, the ferro dielectric film 14a having a thickness of 100 nm, a relative dielectric constant of 150 and a dielectric loss of 1% is formed.

Next, as shown in FIG. 7D, a Pt film having a thickness of 100 nm is grown on the ferro dielectric film 14a by a sputtering method under a condition that a substrate temperature is 400° C., and thus a metallic film 16y for an upper electrode is formed.

Subsequently, as shown in FIG. 7E, a resist film pattern (not shown) is formed by photolithography so that an electrode structure for a capacitor is formed. Predetermined portions of the metallic film 16a for an upper electrode and a ferro dielectric film 14a are etched by ion milling by use of Ar gas and by use of the resist film as a mask. Thus, the ferro dielectric film 14 for the capacitor and the upper electrode 16 for the capacitor are formed. Subsequently, by a similar method in the first embodiment, Ar plasma is radiated onto the surfaces of the upper electrode 16 and the lower electrode 12, and thus minute irregularities are formed.

Next, as shown in FIG. 8A, by a similar method in the first embodiment, silane coupling agent is coated, and a tight adhesion material layer is formed. Thereafter, a first insulative protection film 18 (first insulating film) made of polyimide resin, which has first and second contact holes 18a, 18b in the connection portions 16a and 12a of the upper and lower electrodes 16 and 12, respectively, is formed.

Next, a chromium (Cr) film having a thickness of 80 nm and a copper (Cu) film having a thickness of 500 nm are sequentially grown on the first insulative protection film 18 and in the first and second contact holes 18a, 18b by a sputtering method, and thus a conductive film for a wiring is formed.

Subsequently, as shown in FIG. 8B, the conductive film for a wiring is patterned by wet etching, whereby a wiring 24 is formed. At the time when this process is finished, a state of the capacitor device when the capacitor device of FIG. 8B is viewed from above will be described. As shown in FIG. 10 and FIG. 8B, the first contact hole 18a is formed above the connection portion 16a of the upper electrode 16, and the second contact hole 18b is formed in the connection portion 12a on the lower electrode 12. The wiring 24 is formed so as to extend in one direction on the protection insulating film 18 from the first contact hole 18a above the connection portion 16a of the upper electrode 16. Then, a connection portion 24a electrically connected to a solder bump is delimited in an extension portion at a position in the wiring 24 keeping away from the contact hole 18a.

Next, as shown in FIG. 8C, by a similar method in forming the first insulative protection film 18, a second insulative protection film 26 (second insulating film) having third and fourth contact holes 26a, 26b on the wiring 24 and the first insulative protection film 18 is formed. The second insulative protection film 26 is made of polyimide resin having a thickness of 3 μm or more. The third contact hole 26a opens a connection portion 24a of the wiring 24 extending onto the first insulative protection film 18. Furthermore, the fourth contact hole 26b is formed so as to communicate with the second contact hole 18b of the first insulative protection film 18, and thus a fifth contact hole 26x opening a connection portion 12a of the lower electrode 12 is provided.

Thereafter, by a similar method in the first embodiment, a Ti film, a Cu film and a Ni film are sequentially grown on the second insulative protection film 26 and in the third and fifth contact holes 26a, 26x, and thereafter a Ni plating film is grown by electroless plating. Subsequently, as shown in FIG. 9A, electrode pads 20y (UMB) are formed by etching these metallic films.

Figure 9B:
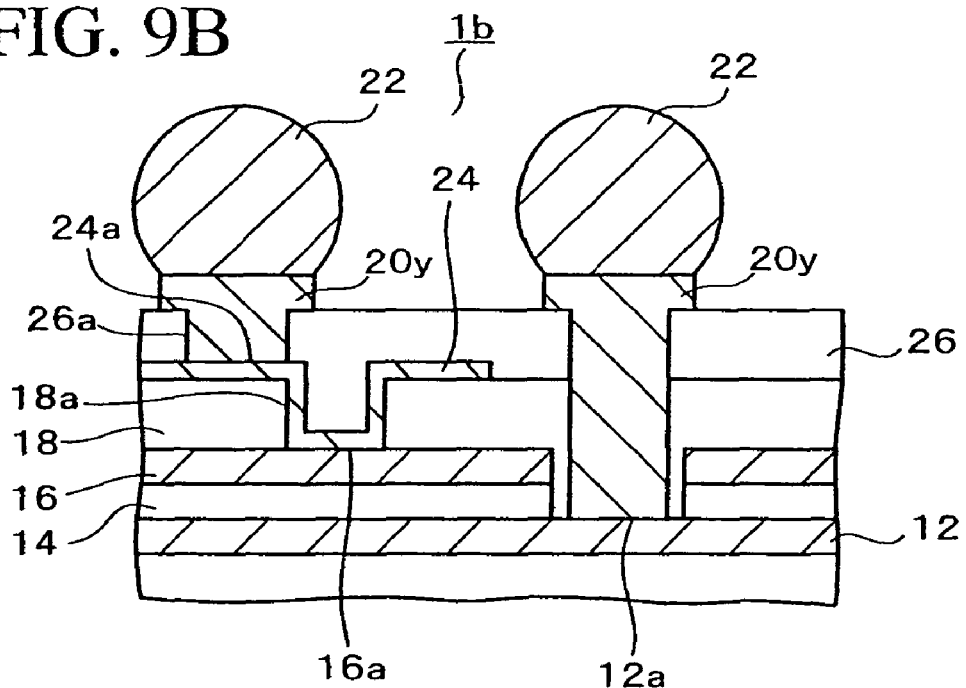
Figure 10:
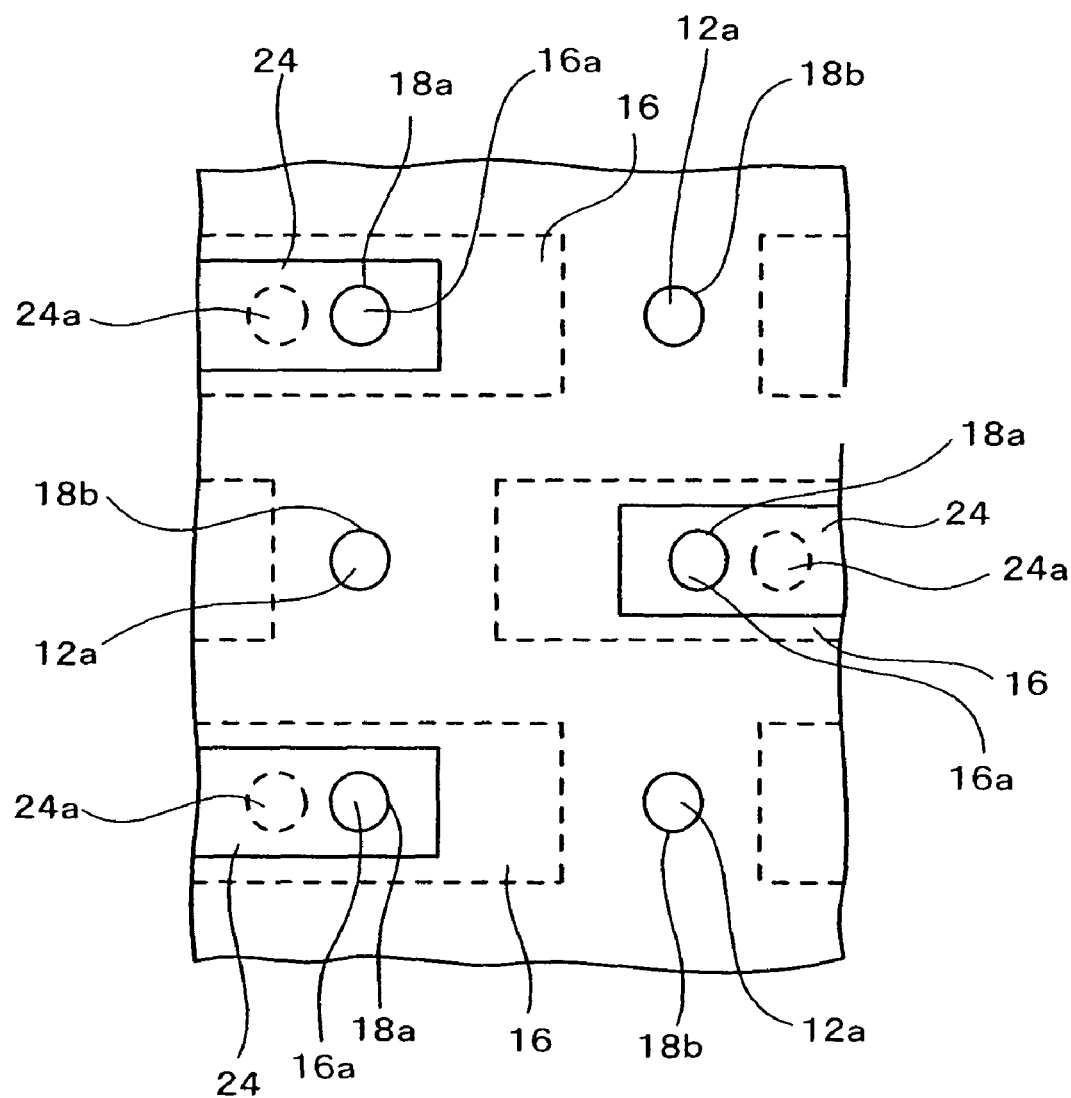
FIG. 10 is a plan view when

Next, as shown in FIG. 9B, by a similar method in the first embodiment, solder bumps are formed on the electrode pads 20y by electroless plating, and then subjected to a thermal treatment (wet back) to reflow, whereby spherical solder bumps 22 are formed. Thus, the connection portion 16a of the upper electrode 16 is electrically connected to the solder bump 22 through the wiring 24 and the electrode pad 20y, and the connection portion 12a of the lower electrode 12 is electrically connected to the solder bump 22 through the electrode pad 20y.

With the above described processes, a capacitor device 1b of the fourth embodiment is obtained.

In the capacitor device 1b of the fourth embodiment, the first contact hole 18a is formed on the connection portion 16a of the upper electrode 16, and the wiring 24 formed in this first contact hole 18a is provided so as to extend in one direction of the first insulative protection film 18 on the upper electrode 16. Specifically, the upper electrode 16 is re-wired by the wiring 24 on the first insulative protection film 18 thereon, and the connection portion 24a electrically connected to the solder bump 22 is provided at a position in the wiring 24 keeping away from the first contact hole 18a. Then, the third contact hole 26a is opened in the second insulative protection film 26 on the connection portion 24a of the wiring 24, and the electrode pad 20y is formed in this third contact hole 26a. The solder bump 22 is formed on the electrode pad 20y. In such a manner, the connection portion 16a of the upper electrode 16 is electrically connected to the solder bump 22 through the wiring 24 and the electrode 20y.

As described above, in the fourth embodiment, the electrode pad 20y is not formed in the first contact hole 18a on the connection portion 16a of the upper electrode 16, but is formed in the third contact hole 26a formed on the wiring 24 on the first insulative protection film 18.

By fabricating the capacitor device as described above, since extension stress occurring from the electrode pad 20y is exerted on the first insulative protection film 18 under the electrode pad 20y, peeling of the films constituting the capacitor Q is prevented even if the lamination layer structure constituted by the ferro dielectric film 14 and the upper electrode 16 or by the ferro dielectric film 14 and the lower electrode 12 exists below the electrode pad 20y.

As described in the first embodiment, the first insulative protection film 18 is formed on the upper electrode 16 in which the irregularities are formed on its surface, and since the first insulative protection film 18 is formed on the upper electrode 16 while interposing the tight adhesion material layer made of the silane coupling agent therebetween, the first insulative protection film 18 is formed with strong adhesion to the upper electrode 16. Therefore, even when the stress of the electrode pad 20y is exerted on the first insulative protection film 18, there is no fear that peeling along the interface between the first insulative protection film 18 and the upper electrode 16 occurs.

In the fourth embodiment, the mode is exemplified, in which the structure constituted by laminating the ferro dielectric film 14 and the upper electrode 16 or by laminating the ferro dielectric film 14 and the lower electrode exists below the first contact hole 18a. As in the case of the first embodiment, a mode may be adopted, in which only the upper electrode 16 of the capacitor Q exists below the first contact hole 18a. In the fourth embodiment, since it is devised that the peeling of the films constituting the capacitor Q is not affected by an arrangement structure of the films, it is possible to prevent the peeling of the films even if a capacitor Q constituted by any arrangement structure of the films exists below the electrode pad 20y.

What is claimed is:

1. A method of manufacturing a capacitor device, comprising:
   forming a first solder diffusion prevention conductive film on or above a substrate, and serving as a lower electrode;
   patterning the first solder diffusion prevention conductive film, thus removing a portion thereof where a connection portion of an upper electrode for a capacitor is disposed, and thus forming the lower electrode for the capacitor in which a predetermined connection portion is delimited;
   forming a dielectric film covering the lower electrode;
   patterning the dielectric film, thus forming a dielectric film for a capacitor exposing a portion where a connection portion of the upper electrode is disposed and exposing a connection portion of the lower electrode;
   forming a second solder diffusion prevention conductive film covering the dielectric film for the capacitor, the second solder diffusion prevention conductive film serving as the upper electrode;
   patterning the second solder diffusion prevention conductive film, thus exposing the connection portion of the lower electrode, and thus forming the upper electrode for the capacitor having the connection portion in a portion where the lower electrode is removed;
   forming an insulating film on the upper electrode, the insulating film having first and second contact holes on the connection portion of the upper electrode and the connection portion of the lower electrode, respectively; and
   forming solder bumps directly contacted with the upper electrode and the lower electrode and electrically connected to the connection portion of the upper electrode and the connection portion of the lower electrode through the first and second contact holes respectively.

2. The method of manufacturing a capacitor device according to claim 1, wherein the first and second solder diffusion prevention conductive films are formed of a platinum (Pt) film having a thickness of 400 nm or more.

3. A method of manufacturing a capacitor device, comprising:
   forming a first conductive film on or above a substrate;
   patterning the first conductive film, thus removing a portion thereof where a connection portion of an upper electrode for a capacitor is disposed, and thus forming a lower electrode for the capacitor in which a predetermined connection portion is delimited;
   forming a dielectric film covering the lower electrode;
   patterning the dielectric film, thus forming a dielectric film for a capacitor exposing a portion where a connection portion of the upper electrode is disposed and exposing a connection portion of the lower electrode;
   forming a second conductive film covering the dielectric film for the capacitor;
   patterning the second conductive film, thus exposing the connection portion of the lower electrode and forming the upper electrode for the capacitor having the connection portion in a portion where the lower electrode is removed;
   forming an insulating film on the upper electrode, the insulating film having first and second contact holes respectively on the connection portion of the upper electrode and the connection portion of the lower electrode;
   forming electrode pads for preventing a diffusion of solder in the first and second contact holes, respectively; and
   forming solder bumps electrically connected to the electrode pads,
   wherein the insulating film directly contacts the dielectric film of opposed direction side to a direction that the upper electrode protrudes on a side surface of a pattern edge of the dielectric film, and
   wherein the insulating film is made of polyimide resin having a thermal expansion coefficient of 15 ppm/° C. or less.

4. A method of manufacturing a capacitor device, comprising:
   forming a first conductive film on or above a substrate;
   patterning the first conductive film, thus removing a portion thereof where a connection portion of an upper electrode for a capacitor is disposed, and thus forming a lower electrode for the capacitor in which a predetermined connection portion is delimited;

forming a dielectric film covering the lower electrode;

patterning the dielectric film, thus forming a dielectric film for a capacitor exposing a portion where a connection portion of the upper electrode is disposed and exposing a connection portion of the lower electrode;

forming a second conductive film covering the dielectric film for the capacitor;

patterning the second conductive film, thus exposing the connection portion of the lower electrode and forming the upper electrode for the capacitor having the connection portion in a portion where the lower electrode is removed;

forming an insulating film on the upper electrode, the insulating film having first and second contact holes respectively on the connection portion of the upper electrode and the connection portion of the lower electrode;

forming electrode pads for preventing a diffusion of solder in the first and second contact holes, respectively;

forming solder bumps electrically connected to the electrode pads, and prior to the forming the insulating film on the upper electrode and after the forming the upper electrode, coating silane coupling agent onto the upper electrode, wherein the insulating film directly contacts the dielectric film of opposed direction side to a direction that the upper electrode protrudes on a side surface of a pattern edge of the dielectric film.

5. A method of manufacturing a capacitor device, comprising:

forming a first conductive film on or above a substrate;

patterning the first conductive film, thus removing a portion thereof where a connection portion of an upper electrode for a capacitor is disposed, and thus forming a lower electrode for the capacitor in which a predetermined connection portion is delimited;

forming a dielectric film covering the lower electrode;

patterning the dielectric film, thus forming a dielectric film for a capacitor exposing a portion where a connection portion of the upper electrode is disposed and exposing a connection portion of the lower electrode;

forming a second conductive film covering the dielectric film for the capacitor;

patterning the second conductive film, thus exposing the connection portion of the lower electrode and forming the upper electrode for the capacitor having the connection portion in a portion where the lower electrode is removed;

forming an insulating film on the upper electrode, the insulating film having first and second contact holes respectively on the connection portion of the upper electrode and the connection portion of the lower electrode;

forming electrode pads for preventing a diffusion of solder in the first and second contact holes, respectively;

forming solder bumps electrically connected to the electrode pads, and prior to the forming the insulating film on the upper electrode and after the forming the upper electrode, forming irregularities in a surface of the upper electrode by radiating plasma thereonto, wherein the insulating film directly contacts the dielectric film of opposed direction side to a direction that the upper electrode protrudes on a side surface of a pattern edge of the dielectric film.

6. A method of manufacturing a capacitor device, comprising:

forming a first conductive film on or above a substrate;

patterning the first conductive film, thus removing a portion thereof where a connection portion of an upper electrode for a capacitor is disposed, and thus forming a lower electrode for the capacitor in which a predetermined connection portion is delimited;

forming a dielectric film covering the lower electrode;

patterning the dielectric film, thus forming a dielectric film for a capacitor exposing a portion where a connection portion of the upper electrode is disposed and exposing a connection portion of the lower electrode;

forming a second conductive film covering the dielectric film for the capacitor;

patterning the second conductive film, thus exposing the connection portion of the lower electrode and forming the upper electrode for the capacitor having the connection portion in a portion where the lower electrode is removed;

forming an insulating film on the upper electrode, the insulating film having first and second contact holes respectively on the connection portion of the upper electrode and the connection portion of the lower electrode;

forming electrode pads for preventing a diffusion of solder in the first and second contact holes, respectively; and forming solder bumps electrically connected to the electrode pads, wherein the insulating film directly contacts the dielectric film of opposed direction side to a direction that the upper electrode protrudes on a side surface of a pattern edge of the dielectric film, and wherein the second conductive film in the connection portion of the upper electrode is exposed on a side surface and a bottom surface in the first contact hole.

* * * * *

UNITED STATES PATENT AND TRADEMARK OFFICE
CERTIFICATE OF CORRECTION

PATENT NO. : 7,832,069 B2
APPLICATION NO. : 11/790732
DATED : November 16, 2010
INVENTOR(S) : Takeshi Shioga et al.

It is certified that error appears in the above-identified patent and that said Letters Patent is hereby corrected as shown below:

On the title page:
Insert

--(30)        Foreign Application Priority Data

August 19, 2002        (JP)   .............................. 2002-238455--

Signed and Sealed this
Twenty-second Day of March, 2011

David J. Kappos
*Director of the United States Patent and Trademark Office*